(12) United States Patent
Cunningham

(10) Patent No.: US 6,208,004 B1
(45) Date of Patent: Mar. 27, 2001

(54) SEMICONDUCTOR DEVICE WITH HIGH-TEMPERATURE-STABLE GATE ELECTRODE FOR SUB-MICRON APPLICATIONS AND FABRICATION THEREOF

(75) Inventor: James A. Cunningham, Saratoga, CA (US)

(73) Assignee: Philips Semiconductor, Inc., Tarrytown, NY (US)

( * ) Notice: Subject to any disclaimer, the term of this patent is extended or adjusted under 35 U.S.C. 154(b) by 0 days.

(21) Appl. No.: 09/136,482

(22) Filed: Aug. 19, 1998

(51) Int. Cl.[7] .................................................. H01L 29/76

(52) U.S. Cl. ........................ 257/413; 257/407; 257/412; 257/900

(58) Field of Search .................................. 257/407, 412, 257/413, 649, 900

(56) References Cited

U.S. PATENT DOCUMENTS

| | | | |
|---|---|---|---|
| 5,023,679 | * 6/1991 | Shibata ................................. | 257/344 |
| 5,026,657 | 6/1991 | Lee et al. .............................. | 438/210 |
| 5,030,585 | 7/1991 | Gonzalez et al. ..................... | 438/210 |

(List continued on next page.)

FOREIGN PATENT DOCUMENTS

| | | | |
|---|---|---|---|
| 0 856 877 | * 8/1998 | (EP) .............................. | H01L/21/28 |
| 4-08-186086 | * 7/1996 | (JP) .............................. | H01L/21/285 |

OTHER PUBLICATIONS

B. El–Kareh et al., The evolution of DRAM cell technology, Solid State Technology, pp. 89–101, May, 1997.*

M. Segawa, T. Yabu, M. Arai, M. Moriwaki, H. Umimoto, M. Sekiguchi, and A. Kanda. A 0.18$\mu$m Ti–Salicided p–MOSFET with Shallow Junctions Fabricated by Rapid Thermal Processing in an Nh$^3$ Ambient, Semiconductor Research Center, Matsushita Electric Industrial Co., Ltd. Moriguchi, Osaka 570 Japan. IEDM 96–443.

Takagi et al., "A Novel 0.15am CMOS Technology Using W/WN/Polysilicon Gate Electrode . . ." 1996 IEDM p. 445.

Jenkins et al. "Identification of Gate Electrode Discontinuites . . .", IEEE Trans. Electron Dev., v.43, May 1996, p. 759.

Wakabayashi et al. "Highly Reliable W/TiN/pn–poly/Si Gate DMOS Technology . . ." 1996 IEDM, p. 447.

Suni et al. "Thermal Oxidation of Reactively Sputtered Titanium Nitride . . . " J. Electrochem Soc., v. 30, May 1983, p. 1210.

Kasai et al. "W/WNx/Poly–Si Gate Technology for Future High Speed . . . 1994 IEDM, p. 497".

*Primary Examiner*—Mahshid Saadat
*Assistant Examiner*—George C. Eckert, II

(57) ABSTRACT

An improved gate electrode provides greater tolerances to higher temperature annealing treatments, and is useful in connection with the formation of self-aligned contacts as are needed for high density embedded DRAM applications. Consistent with one embodiment, a process for manufacturing a polycide transistor gate electrode involves forming a cap dielectric and dielectric spacer, with the electrode exhibiting a reduced diffusion transport of dopants between an underlying doped polysilicon layer and an overlying silicide layer. The reduced transport results from the presence of a thin barrier layer between the doped polysilicon layer and silicide layer, and the gate electrode process forms a thermally-oxidized thin polysilicon side-wall film against the polysilicon layer, the barrier layer, the silicide layer, and the cap dielectric layer. The polysilicon side-wall film is used for blocking substantial oxidation of the barrier film.

4 Claims, 3 Drawing Sheets

U.S. PATENT DOCUMENTS

| | | | |
|---|---|---|---|
| 5,057,449 | 10/1991 | Lowrey et al. | 438/251 |
| 5,091,763 | 2/1992 | Sanchez | 257/344 |
| 5,166,771 | 11/1992 | Godinho et al. | 257/368 |
| 5,173,450 | 12/1992 | Wei | 438/620 |
| 5,182,234 | 1/1993 | Meyer | 438/695 |
| 5,188,976 | 2/1993 | Kume et al. | 438/258 |
| 5,192,703 | 3/1993 | Lee et al. | 438/396 |
| 5,196,357 | 3/1993 | Boardman et al. | 438/304 |
| 5,229,307 | 7/1993 | Vora et al. | 438/234 |
| 5,329,482 | 7/1994 | Nakajima et al. | 365/182 |
| 5,332,687 | 7/1994 | Kuroda | 438/241 |
| 5,341,014 | 8/1994 | Fujii et al. | 257/377 |
| 5,369,055 | 11/1994 | Chung | 438/533 |
| 5,389,558 | 2/1995 | Suwanai et al. | 438/241 |
| 5,504,029 | 4/1996 | Murata et al. | 438/241 |
| 5,612,241 | 3/1997 | Arima | 438/241 |
| 5,652,464 | 7/1997 | Liao et al. | 257/751 |
| 5,668,035 | 9/1997 | Fang et al. | 438/239 |
| 5,719,410 * | 2/1998 | Suehiro et al. | 257/77 |
| 5,776,823 * | 7/1998 | Agnello et al. | 438/592 |
| 5,818,092 * | 10/1998 | Bai et al. | 257/388 |
| 5,874,353 * | 2/1999 | Lin et al. | 438/592 |
| 5,923,999 * | 1/1999 | Balasubramanyam et al. | 438/592 |
| 5,940,725 * | 8/1999 | Hunter et al. | 438/592 |
| 5,946,548 * | 8/1999 | Hashimoto et al. | 438/41 |
| 5,972,765 * | 10/1999 | Clark et al. | 438/308 |
| 5,981,380 * | 11/1999 | Trivedi et al. | 438/639 |
| 5,998,264 * | 12/1999 | Wu | 438/260 |
| 5,998,290 * | 12/1999 | Wu et al. | 438/595 |
| 6,004,869 * | 12/1999 | Hu | 438/585 |

* cited by examiner

SEMICONDUCTOR DEVICE WITH HIGH-TEMPERATURE-STABLE GATE ELECTRODE FOR SUB-MICRON APPLICATIONS AND FABRICATION THEREOF

FIELD OF THE INVENTION

The present invention relates generally to semiconductor devices and semiconductor manufacturing. More particularly, the present invention relates to an improved process for high-performance sub-micron CMOS technologies as may be found in high-performance logic applications such as state-of-the-art microprocessors or embedded DRAM implementations.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon die or chips. As the number of electronic devices per given area of the silicon wafer increases, the manufacturing process becomes more difficult.

Metal-oxide-semiconductor (MOS) transistors, including the combining of n-channel and p-channel transistors as required for complimentary MOS (CMOS) technology, have been widely used to increase the density and performance of silicon-based electronic devices. CMOS technology has found its way into a wide variety of semiconductor device types, including microprocessors, various other logic applications and high density commodity DRAMs. By the late 1990s, each of these applications have had the common characteristic of very small, submicron (e.g., 0.18 to 0.35 micron) minimum features sizes. These logic applications and high density commodity DRAMs also exhibited a variety of significant structural differences.

For example, high performance logic device technologies: have reached minimum feature sizes (referring to transistor length values as measured across the gate electrode) in the 0.18 micron to 0.25 micron range; have applied four to six levels of metal interconnect; have used dual-doped gate electrodes (p+ polysilicon for p-channel and n+ polysilicon for n-channel transistors, sometimes referred to as dual-poly or dual-gate technology) in order to aid downward scaling and to help force each transistor type into the surface channel mode; have replaced the older LOCOS-based isolation process with shallow trench isolation (STI) giving much flatter surfaces and better control of the transistor width dimension; have successfully scaled the gate oxide to a range between 45 Angstroms and 65 Angstroms; and have formed silicides (usually titanium based) on the source/drain areas and polysilicon gate electrodes, using the well-known salicide process, thereby reducing lower-level interconnect RC delays.

The many levels of upper-level interconnect in such logic technologies have been separated by thick dielectrics, reducing capacitive coupling. This has required high aspect ratio vias filled with tungsten plugs which have been typically formed using a CVD tungsten process. But the tungsten plug contacts to substrate are not self aligned contacts (SAC). Extensive use of chemical mechanical polishing (CMP) has been used to provide the necessary planarization. This high performance technology has yielded logic products operating at clock rates of 250 MHz and higher.

In contrast, DRAM technologies have concentrated primarily on reducing the size of the capacitor associated with the MOSFET transistor used in connection with the capacitor memory cell, and has looked quite different from state-of-the-art high performance logic technologies. For example, since the memory cell has little tolerance for PN junction leakage, salicides are typically not used. The gate electrodes are typically polycides, using $WSi_2$, with a cap oxide or nitride as is needed to form a self-aligned contact (SAC).

An important part of DRAM implementations is providing a low resistance word line for accessing memory cell data. For this reason, polycides have been used where the silicide may be somewhat thicker than that normally found in salicides. In some DRAM implementations, such as the illustrated example addressed above, a polysilicon landing-pad SAC is formed right up against the insulated gate electrode. The relatively thick dielectric spacer and cap oxide prevents shorting.

Due to its strict requirement to minimize leakage, DRAM has been late in implementing STI (shallow trench isolation) and, rather, has stayed with the older and well-characterized LOCOS-based isolation process. DRAM processes have typically formed no more than two levels of metal interconnect.

DRAM technology also typically uses thicker gate oxides since word line voltages may be boosted. Attainment of extremely robust transistors, using very thin gate oxides, is less important to DRAM technology. More important concerns have been high yield, high density, and long-term reliability. Thus, DRAM performance, as measured by clock rates, is usually significantly less than high performance logic implementations.

The typical DRAM capacitor is used in a variety of forms, with the stacked polysilicon-type dominating. DRAMs generally have not used dual-doped gate electrodes.

There is a recognized need to combine DRAM and high performance logic processes into what is generally referred to as embedded DRAM. To use the typical high density DRAM cell in the logic process, a self-aligned contact is needed. But the salicide process, as required for high performance logic, does not readily tolerate a thick cap oxide; its presence, of course, precludes the necessary interdiffusion of titanium or other refractory metal with the exposed polysilicon gate electrodes. On the other hand, a salicide process may be applied to the source/drain regions if the gate electrode is already provided with a silicide and is covered with a protective oxide or nitride film.

In view of the above and in connection with the present invention, it has been recognized that an advantageous gate electrode structure would offer dual-gate (p+ and n+ poly) capability, high conductivity like that of conventional polycides, cap oxides or nitrides and other more robust edge insulation, such that a self-aligned contact may be placed against this electrode, and improved thermal stability such that high temperature dopant activation anneals may be performed without excessive dopant migration into the overlying silicide. It is well known that dopants have very high diffusion rates in silicides as compared to polysilicon.

One approach to the dopant diffusion problem is to place a conductive barrier layer between the doped polysilicon and the overlying silicide. In a specific implementation of this type, a polycide gate structure includes a TiN barrier between layers of polysilicon and $TiSi_2$. It has been reported, however, that upon reoxidation, the TiN barrier converts to TiO creating high contact resistance between the silicide and the underlying polysilicon. For further information concerning such efforts, reference may be made to "Identification of Gate Electrode Discontinuities, in Submicron CMOS Technologies, and effect on Circuit Performance", Keith A. Jenkins, et al., IEEE Trans. Electron Dev., v.43, May 1996, p.759. See also "Highly Reliable W/TiN/pn-poly-Si Gate DMOS Technology with Simultaneous Gate and Source/Drain Doping Process," Hitoski Wakabayashi et al., 1996 IEDM, p.447; and "W/WNx/Poly-Si Gate Technology for Future High Speed Deep Submicron DMOS LSIs," K. Kasai, et al, 1994 IEDM, p.497; and "A Novel 0.15 am CMOS Technology using W/WN,/Polysilicon Gate Electrode and Ti Silicided Source/Drain Diffusions," M. T. Takagi, et al., 1996 IEDM, p.455. Each of these references is incorporated herein by reference as background information to the present invention.

SUMMARY OF THE INVENTION

The present invention has a variety of uses including improved gate electrode processes and structures, and provides benefits including significantly greater tolerances to higher temperature annealing treatments. In addition, the present invention is useful in connection with the formation of self-aligned contacts as are needed for high density embedded DRAM applications.

The present invention is characterized and exemplified in a number of implementations and applications, some of which are summarized below.

According to one method embodiment, a polycide transistor gate electrode process involves a cap dielectric and dielectric spacer which exhibits a reduced diffusion transport of dopants between the underlying doped polysilicon and the overlying silicide. The reduced transport results from the presence of a thin barrier layer between said doped polysilicon layer and silicide layer, and the gate electrode process forms a thin polysilicon side-wall film against the polysilicon, barrier, silicide, and cap dielectric layers which is thermally oxidized. The polysilicon side-wall film is used for blocking substantial oxidation of the barrier film. The thin barrier film extends substantially across the doped polysilicon film and terminates close to said side-wall thermal oxide.

Another embodiment of the present invention involves a transistor gate electrode process comprising: forming an underlying polysilicon film and an overlying refractory metal nitride film, which is covered with a thin silicon nitride film which, in turn, is covered with a polysilicon film; forming, after photolithographic patterning a thin silicon nitride side-wall film against said polysilicon, refractory metal nitride, silicon nitride, and overlying polysilicon film; and forming lightly doped source and drain regions by ion implantation wherein the dopants penetrate said refractory metal nitride, silicon nitride and overlying polysilicon film and said penetrating dopants appropriately dope the underlying polysilicon film; and then oxidizing said overlying polysilicon film. The oxidized polysilicon film is again penetrated upon fmal n+ or p+ source/drain implants.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
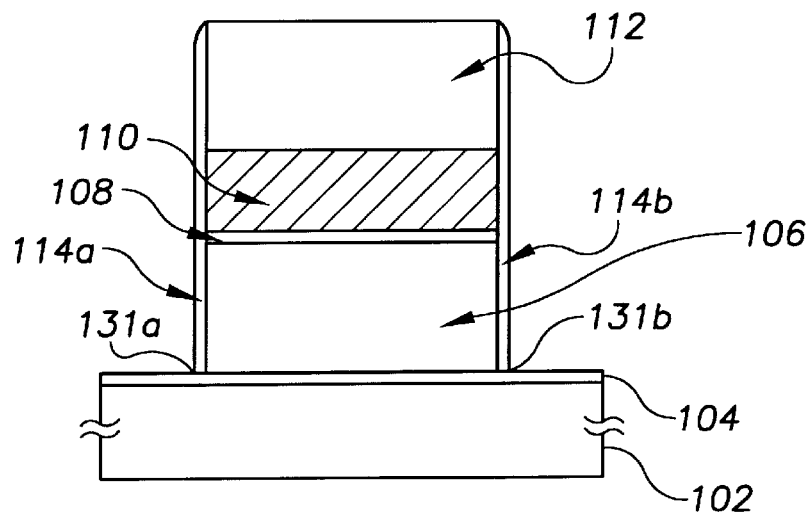
FIGS. 1 and 2 illustrate cross-sectional views of a semiconductor gate structure including a barrier layer, at different stages of processing, according to a first example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF VARIOUS EMBODIMENTS

According to one application, the present invention provides temperature stable, cap dielectric protected, polycide-like gate electrodes suitable for forming an adjacent self-aligned contact. These gate electrodes are also suitable for dual-gate processes.

The improved temperature stable gate electrodes, described herein using two example embodiments, provide a level of temperature stability useful for overcoming a variety of other limiting factors already present in many high performance logic processes. For example, the elevated temperature problem arises from several divergent needs; that is, several process steps benefit from a high temperature anneal, but several necessary structures already in place are temperature unstable.

The need for a high temperature anneal comes primarily from a required dopant activation step. Following the doping of the source/drain areas, and in some cases, the concurrent doping of the polysilicon gate electrodes, by ion implantation, it is necessary to activate the dopants by a high temperature anneal. Ideally, this temperature is around 950 degress C. or higher. Lower temperatures tend to reduce the active doping concentration, which needs to be very high in order to avoid polysilicon depletion effects, to properly set the threshold voltage, and to provide high conductivity. Other high temperature steps can arise during preparation of the insulation over the gate electrodes (glass flow, for example), and in various other steps.

Temperatures this high, however, can create a variety of problems. One such problem is rapid dopant diffusion. In rapid dopant diffusion, the dopants in the polysilicon may rapidly diffuse and become depleted through the overlying silicides. This causes threshold voltage ($V_T$) shifts and possible poly-depletion problems. If the two types of polysilicon are in contact, dopant compensation effects occur upon diffusion and intermixing of the dopants. Another problem is boron penetration of the gate oxide. This involves the boron in the p+ polysilicon gate penetrating the gate oxide causing $V_T$ shifts. Silicide agglomeration is another problem which arises when thin suicides agglomerates from the salicide process; this causes a resistivity increase. In addition, increased PN junction leakage can occur when the silicides approach the depth of the shallow PN junctions.

The present invention has been found to be advantageous in overcoming many of these problems, and is particularly advantageous when used in connection with logic circuits having embedded-DRAM, stand-alone logic applications and stand-alone DRAM applications. While the present invention is not necessarily limited to these environments, an appreciation of various aspects of the invention is best gained through a discussion of two specific example embodiments.

In the first embodiment, a thermally stable polycide-like gate electrode is prepared with either p+ or n+ doped polysilicon and an overlying very thin film of a barrier layer such as TiN or WN, a film of refractory metal silicide, and a cap oxide approximately the same thickness as the lower doped polysilicon layer. The stack is patterned using conventional photolithography methods and plasma etching, and a thin polysilicon spacer is applied. The polysilicon is thermally oxidized accomplishing a beneficial reoxidation at the lower gate edge. The barrier film is protected from oxidation by the polysilicon spacer. Dopants from the bottom doped polysilicon will not substantially diffuse into the overlying silicide layer at dopant activation temperatures. Dopants in the gate electrodes may be fully activated prior to source/drain or salicide formation. The process uses an initial photomasked doping of the polysilicon (n+ and p+) prior to forming the transistor source and drain area.

According to a specific application, the refractory metal nitrides block dopant or silicon migration to the extent needed in the example embodiments of the present invention. Virtually all refractory metal nitrides are rapidly oxidized under those conditions required for a practicable reoxidation process. One published report has shown, for the thermal oxidation of TiN and HfN, that approximately 1000 Anstroms of TiN would be oxidized in 10 min. at 600° C. in $O_2$. In this report, the heats of formation for mononitrides and oxides of several refractory metals are reproduced as follows:

| Metal | Nitride | | Oxide | |
|---|---|---|---|---|
| Ti | TiN | 80.4 | $TiO_2$ | 219 |
| Zr | ZrN | 87.3 | $ZRO_2$ | 259 |
| Hf | HfN | 88.2 | $HfO_2$ | 272 |
| V | VN | 52.0 | $V_2O_5$ | 192 |
| Nb | NbN | 59.0 | $Nb_2O_5$ | 232 |
| Ta | TaN | 59.0 | $Ta_2O_5$ | 250 |

The units shown are Kcal/g mole per metal atom. For further information, reference may be made to: "Thermal Oxidation of Reactively Sputtered Titanium Nitride and Hafnium Nitride Films," I. Suni, et al., J. Electrochem. Soc., v.30, May 1983, pg. 1210, incorporated herein by reference. The average energy gain upon oxidation is about 150 Kcal/g mole. In a specific application, a typical reoxidation employs steam plus nitrogen, or $O_2+N_2$, for five to twenty minutes at 800 to 900° C. As a result, all the listed nitrides are readily oxidized.

Boron penetration of the thin gate oxide may be reduced by known methods, such as by implanting the oxide with nitrogen, forming the gate oxide with $N_2O$ or NO, and/or reducing the pressure of fluorine using boron implantation species instead of $BF_2+$. Large grained polysilicon may also be used to reduce boron penetration, as is known in the art.

Figure 2:
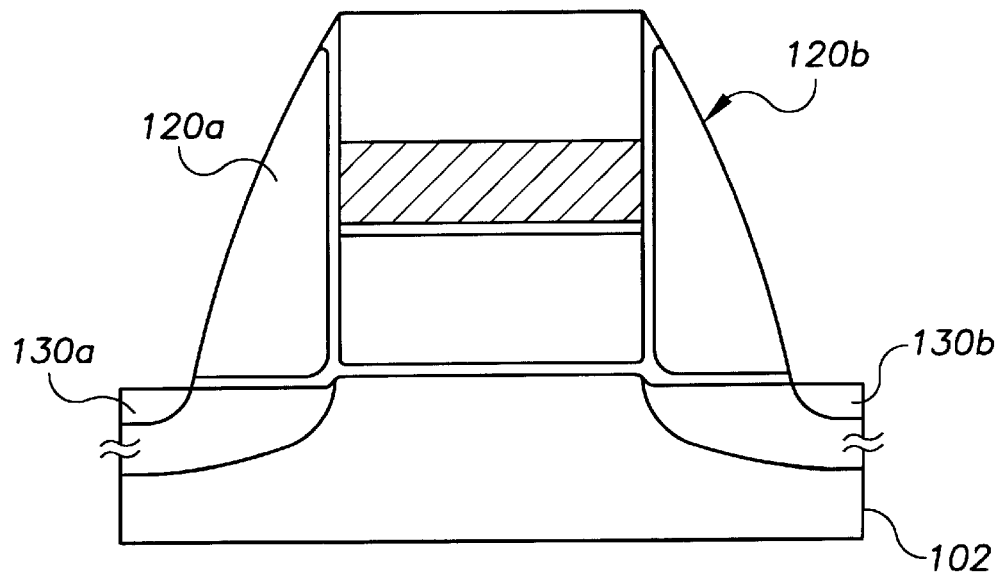

Consistent with this first embodiment, FIGS. 1 and 2 depict cross-sectional views of an integrated circuit structure, for example, as part of DRAM-embedded logic circuitry. More particularly, FIG. 1 illustrates an integrated circuit gate structure at a preliminary stage of processing, and FIG. 2 illustrates the same gate structure at a later stage of processing. Consistent therewith, a method is used to fabricate this illustrated structure, as follows.

A silicon substrate 102 is the underlying structure for a layer of gate oxide 104 e.g., about 60 Angstroms. Polysilicon is deposited to form the next layer 106.

Using appropriate photomasking, the polysilicon layer 106 is doped in sheet form for an n+ or p+ gate, as the application may require, and the next layers are formed. A barrier layer 108, including for example TiN or WN, is then deposited over the doped polysilicon layer 106, for example, by chemical vapor deposition (CVD) or sputtering. The barrier layer 108 preferably includes such a refractory metal compound to inhibit lateral diffusion of dopant from the polysilicon in an overlying layer 110 of silicide. This overlying silicide layer 110 is then formed, for example, by CVD methods. An $SiO_2$ (oxide) cap layer 112 is then formed over the silicide layer 110.

A photoresist pattern is then applied and the stack of films are plasma etched. The photoresist is then removed by conventional oxygen plasma methods.

Insulative side wall structures 114a and 114b are then formed. In one implementation, the side wall structures 114a and 114b are formed by depositing a thin conformal polysilicon. The polysilicon is then anisotropically etched back to form the illustrated vertically-arranged structures 114a and 114b. The lightly doped source and drain regions 130a and 130b are formed using an n− or p− ion implant process with appropriate masking, as is well known in the art. A rapid thermal anneal (RTA) process is used to activate the implanted regions.

After a light-buffered oxide etch, the thin polysilicon spacers are thermally oxidized. A small, beneficial bird's beak, 131a and 131b, simultaneously forms at the lower gate electrode edge. The oxidation step has good process latitude since the thin polysilicon spacers do not have to be fully converted to $SiO_2$.

Spacers 120a and 120b are then formed by using conventional deposition and anisotropic etch-back of $SiO_2$ or silicon nitride, depending on the design of the self-aligned contact process. The most heavily doped n+ or p+ regions 130a and 130b are then formed by ion implantation in the $10^{15}$ atom/cm$^2$ dose range as is well known in the art.

Consistent with the above-described embodiment, example film thicknesses for a particular example embodiment are: n+ or p+ polysilicon layer, about 1000 Angstroms; TiN or WN layer 108, about 50 Angstroms; $TiSi_2$ or $WSi_2$, about 500 Angstroms; cap oxide or nitride 112, about 900 Angstroms; polysilicon film 114a or 114b, about 50 Angstroms; and spacers 120a and 120b at deposition, about 900 Angstroms.

In submicron transistors, it is desirable to perform a light oxidation, often referred to as "reox," after annealing the n− or p− implants for the lightly-doped drain (LDD) regions. This reox grows a very small bird's beak at the lower gate edge, thereby lowering the area's electric field. Reox also stabilizes the gate oxide near the gate electrode, and may protect it from contamination. A light-buffered HF etch may be performed on the exposed source and drain gate oxide prior to the reox for yielding reduced levels of contamination.

The polycide can be plasma etched with a species of high selectivity over silicon oxide, such as $SF_6+HBr$, so that little gate oxide lying outside the area of the gate electrode is etched.

If nitride spacers 120a, 120b are used, a reox is used to avoid the presence of a silicon nitride/silicon (or natural oxide) interface which tends to aggravate the well-known hot-carrier problem. Improvements have been reported with a light oxidation forming up to 100 Angstroms of oxide under nitride spacers. A nitride spacer can be anisotropically plasma etched using an $SF_6\backslash CF_4$ species.

In a particular example embodiment, the oxide layer 104 is 60 Angstroms in thickness, the polysilicon layer 106 is 1000 Angstroms in thickness, the barrier layer 108 is 60 Angstroms in thickness, the titanium silicide layer 110 is 500 Angstroms in thickness, and the cap oxide is 900 Angstroms in thickness. The thickness of the polysilicon side wall structures 114a and 114b is initially 50 Angstroms and after conversion, 100 Angstroms. These numbers are approximations.

Following the n+ and p+ source/drain implants, an undoped oxide about 700 Angstroms may be (optionally) deposited as a salicide exclusion mask. The silicon over the source and drain regions may then be opened with appropriate photolithography and a Ti or Co based salicide process may be carried out as is known in the art. The gate electrodes do not, of course, participate in this process.

Figure 4A:
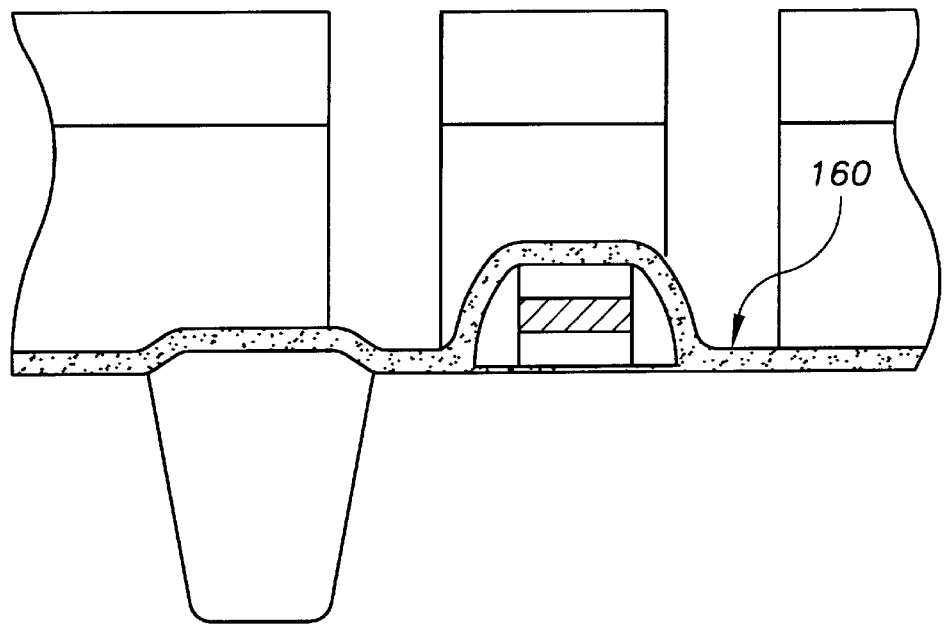
FIGS. 4a and 4b illustrate cross-sectional views of another semiconductor gate structure including a self-aligned contact processed according to an embodiment of the present invention.
Figure 4B:
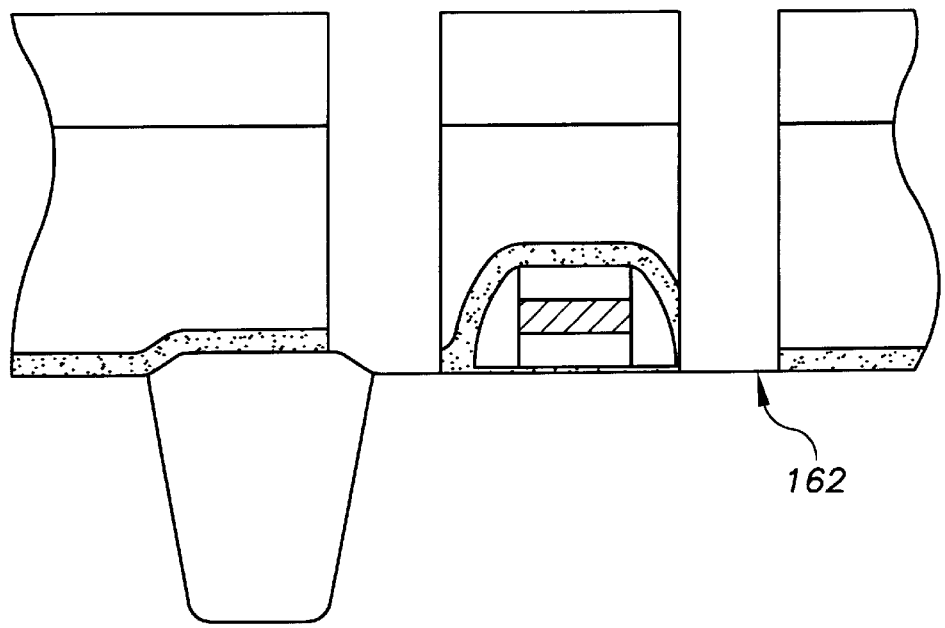

The gate electrodes are then ready for a self-aligned gate module as seen in FIGS. 4a and 4b. Apart from the inclusion of the gate electrodes, the processing shown in FIGS. 4a and 4b is conventional. The thick oxide is plasma etched to the silicon nitride 160. The nitride is then etched until the oxide 162 is reached. Not shown in FIG. 4a are the thin barrier layer and the thin spacer.

In a second embodiment, a thermally stable polycide-like gate electrode is formed which may be doped n+ or p+ at the same time the sources and drains are doped either n+ or p+. This saves two photomasking steps. A stack of about 1000 Å of undoped polysilicon is formed with an overlying approximately 250 Å thick barrier layer of TiN or ZrN, and a very thin overlying silicon nitride, and a very thin overlying about 100 Å film of polysilicon. The stack of films is patterned and a thin (e.g., about 100 Å) silicon nitride spacer is formed in the conventional manner (deposition and anisotropic plasma etch back). Lightly doped source and drain implants are completed. The films over the bottom polysilicon layer are thin enough to be penetrated during the implant. The upper polysilicon is oxidized forming a cap oxide such that the stack is suitable for SACs, and a beneficial reoxidation occurs at the lower gate edge. The TiN or ZrN film improves the conductivity of the stack as is the case in a conventional polycide. Conventional silicon nitride spacers are then added, as is known in the art, and the p+ and n+ source and drain regions are formed by ion implantation. The polysilicon regions are additionally doped through the thin layers. The final spacers are not shown in FIGS. 3a and 3b. The silicon nitride may be selectively plasma etched down to oxide layer 150. Dopants in the polysilicon may be activated up to temperature limits set by other structures, such as salicided areas, without dopant intermixing in the gate electrodes.

Figure 3A:
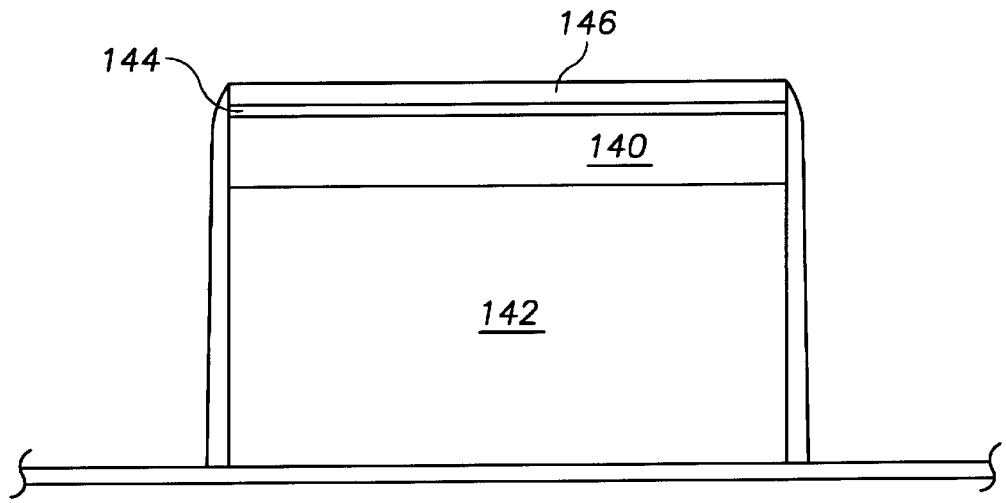
FIGS. 3a and 3b illustrate cross-sectional views of a semiconductor gate structure including a barrier layer, at different stages of processing, according to a second example embodiment of the present invention.
Figure 3B:
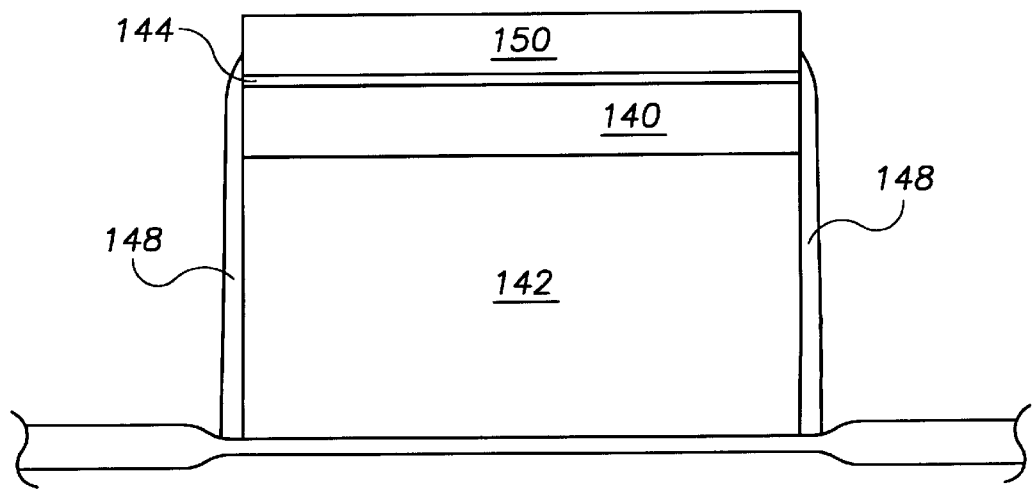

Consistent with this second embodiment, FIGS. 3a and 3b illustrate a gate electrode constructed using a thin coating or layer 140 (e.g., about 250 Angstroms) of ZrN, HfN or TiN over initially undoped polysilicon layer (about 1000 Angstroms) 142. The metal nitride layer 140 is covered by a thin protective $Si_3N_4$ layer 144. Over this layer 144 for example, about 50 Angstroms, a layer 146 about 100 Angstroms thick of polysilicon is applied. Plasma etching the structure is facilitated since the differential etch rates of p+ and n+ polysilicon are not a factor. After delineation, the resist is striped and a silicon nitride spacer 148 approximately 100 Angstroms thick is applied. The n– and p– LDD implants are then applied. The structure is then reoxidized, as shown in FIG. 3b. This realizes a cap oxide layer 150 of about 200 Angstroms (FIG. 3b). A nitride spacer is then applied and the n+ and p+ implants are completed.

At 70 to 80 keV for As and about 50 to 60 keV for $BF_2$+(lower voltage for boron ions), the dopant range is about 400 Angstroms. The dopants would then penetrate the films lying over the undoped polysilicon forming the appropriate p+ and n+ polysilicon gate electrodes. Upon dopant activation, no dopant will be lost into the overlying nitride. The activation may be done at a temperature high enough to uniformly distribute the dopant atoms, but consistent, of course, with the need to limit boron penetration. This will reduce gate electrode depletion problems which can cause a reduction in transistor transconductance.

Use of 250 Angstroms TiN instead of ZrN would yield a film with an $R_s$ of about 16 ohms/square. HfN would give about 12 ohms/square. ZrN would give about 7 ohms/square.

The structure of FIG. 3b with spacers may be then processed as illustrated in connection with FIGS. 4a and 4b for formation of the self-aligned contact, as discussed below. In this embodiment, however, an etch stop against the spacer does not occur.

The steps of FIGS. 4a and 4b may be used after preparation of the gate electrodes and doping of the sources and drains, but prior to application of the tungsten (or poly) plug module. Various alternatives for this process are known in the art.

The example structure of FIG. 4a may be fabricated using a salicide process that incorporates the structure of FIG. 2. In a particular application, the structure shown in FIG. 2 is used to form a self-aligned contact suitable, for example, for 0.18 to 0.25 micron technology levels. In accordance with the present invention, the structure of FIG. 2 is further processed by forming the n+, p+ regions 130a, 130b after forming the spacers 120a, 120b, and then conformally depositing a thick layer (e.g., 700 Angstroms) of undoped silicon oxide which is used for salicide exclusion.

A self-aligned contact module is then built using the nitride layer shown as an etch stop. The nitride is then subsequently etched using the oxide spacers as an etch stop.

For embedded DRAM applications, the salicide may be excluded in the DRAM cell areas if desired or necessary by appropriate masking films. For further information concerning such processes and structures, reference may be made to "Semiconductor Device with Gate Electrodes for Submicron Applications and Fabrication thereof," U.S. patent application Ser. No. 09/115,714, filed on Jul. 15, 1998, now U.S. Pat. No. 6,110,818, issued Aug. 29, 2000 (Docket No. VLSI.91PA), incorporated herein by reference in its entirety.

While the present invention has been described with reference to several particular example embodiments, those skilled in the art will recognize that many changes may be made thereto without departing from the spirit and scope of the present invention, which is set forth in the following claims.

What is claimed is:

1. A semiconductor device including a transistor gate electrode located over a semiconductor material having source and drain regions, the device comprising: an underlying polysilicon film, an overlying refractory metal nitride film, a silicon nitride film over the refractory metal nitride film, and an overlying oxidized polysilicon film; and, formed after photolithographic patterning, a thin silicon nitride side-wall film against the underlying polysilicon film, the refractory metal nitride film, the silicon nitride film, and overlying the oxidized polysilicon film; and ion implantation dopants in the source and drain regions, and also penetrating the underlying polysilicon film, the refractory metal nitride, the silicon nitride, and the overlying oxidized polysilicon film.

2. A semiconductor device including a transistor gate electrode, according to claim 1, further including at least one additional side-wall dielectric spacer.

3. A semiconductor device including a transistor gate electrode, according to claim 2, further including a small bird's beak at the lower edge of the underlying polysilicon film.

4. A semiconductor device including a transistor gate electrode, according to claim 1, wherein the overlying refractory metal nitride film includes zirconium.

* * * * *